US012666970B2

(12) United States Patent
Lee et al.

(10) Patent No.: US 12,666,970 B2
(45) Date of Patent: Jun. 23, 2026

(54) SEMICONDUCTOR PACKAGE

(71) Applicant: SAMSUNG ELECTRONICS CO., LTD., Suwon-si (KR)

(72) Inventors: Yongkoon Lee, Suwon-si (KR); Myungsam Kang, Hwaseong-si (KR); Youngchan Ko, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 889 days.

(21) Appl. No.: 17/929,159

(22) Filed: Sep. 1, 2022

(65) Prior Publication Data

US 2023/0148143 A1 May 11, 2023

(30) Foreign Application Priority Data

Nov. 5, 2021 (KR) ......................... 10-2021-0151626

(51) Int. Cl.
*H10W 42/20* (2026.01)
*H10W 44/00* (2026.01)
(Continued)

(52) U.S. Cl.
CPC ......... *H10W 42/20* (2026.01); *H10W 44/501* (2026.01); *H10W 70/65* (2026.01); (Continued)

(58) Field of Classification Search
CPC ............... H01L 23/552; H01L 23/3128; H01L 23/49816; H01L 23/49833; H01L 23/49838; H01L 23/645; H01L 23/49822;

H01L 24/08; H01L 2224/08235; H01L 2924/1431; H01L 2924/1434; H01L 2924/30105; H01L 2924/3025
See application file for complete search history.

(56) References Cited

U.S. PATENT DOCUMENTS 5,416,356 A * 5/1995 Staudinger ............. H10D 84/00
257/531
8,289,656 B1 10/2012 Huber
(Continued)

FOREIGN PATENT DOCUMENTS

CN 103887279 6/2014
EP 1367645 A2 12/2003
(Continued)

*Primary Examiner* — Jacob Y Choi
*Assistant Examiner* — Neil R Prasad
(74) *Attorney, Agent, or Firm* — Morgan, Lewis & Bockius LLP

(57) ABSTRACT

Disclosed is a semiconductor package comprising a substrate, a semiconductor chip on the substrate, a vertical structure on the substrate on one side of the semiconductor chip, a molding layer on the substrate and surrounding the semiconductor chip and the vertical structure, and a conductive pattern on the molding layer. The vertical structure includes a first part connected to a ground conductor of the substrate, and at least one second part on the first part and having a width less than a width of the first part. The conductive pattern includes at least one pad vertically spaced from the at least one second part, and an inductor pattern connected to the at least one pad. The at least one second part and the at least one pad form at least one capacitor.

20 Claims, 11 Drawing Sheets

(51) Int. Cl.
| | |
|---|---|
| *H10W 70/65* | (2026.01) |
| *H10W 74/10* | (2026.01) |
| *H10W 90/00* | (2026.01) |
| *H10W 70/685* | (2026.01) |

(52) U.S. Cl.
CPC ........ *H10W 74/117* (2026.01); *H10W 90/401* (2026.01); *H10W 90/701* (2026.01); *H10W 70/685* (2026.01); *H10W 90/794* (2026.01)

(56)                References Cited

U.S. PATENT DOCUMENTS

| | | | |
|---|---|---|---|
| 9,984,960 B2 | 5/2018 | Hwang et al. | |
| 10,236,209 B2 | 3/2019 | Sharan et al. | |
| 2014/0021522 A1* | 1/2014 | Lin ..................... | H01L 23/5329 |
| | | | 257/299 |
| 2017/0025363 A1* | 1/2017 | Tsai .................. | H01L 23/49838 |
| 2018/0122772 A1* | 5/2018 | Kim ........................ | H01L 25/50 |

FOREIGN PATENT DOCUMENTS

| | | | |
|---|---|---|---|
| KR | 2002-0082293 A | 10/2002 | |
| KR | 2002-0086741 A | 11/2002 | |
| KR | 10-1297015 | 8/2013 | |
| KR | 10-1653563 | 9/2016 | |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2021-0151626, filed on Nov. 5, 2021 in the Korean Intellectual Property Office, the disclosure of which is hereby incorporated by reference in its entirety.

TECHNICAL FIELD

This disclosure relates generally to a semiconductor package, and more particularly, to a semiconductor package having a noise reduction filter.

DISCUSSION OF RELATED ART

A semiconductor package may include a semiconductor chip within which a semiconductor device is formed, and one or more redistribution layers (RDLs) adjacent to the semiconductor chip. One example of the semiconductor device is a semiconductor memory, which is broadly classified into a volatile memory device, such as a static random access memory (SRAM), a dynamic random access memory (DRAM), and a synchronous dynamic random access memory (SDRA). Other examples include a non-volatile memory device, such as a read-only memory (ROM), a programmable read-only memory (PROM), an electrically programmable read-only memory (EPROM), an electrically erasable and programmable read-only memory (EEPROM), a flash memory, a phase change random access memory (PRAM), a magnetic random access memory (MRAM), a resistive random access memory (RRAM), and a ferroelectric random access memory (FRAM). Other examples of semiconductor devices include application processors, analog/digital control devices, and monolithic microwave integrated circuits (MMICs).

In general, a packaged semiconductor device transmits and receives signals to and from an external apparatus (e.g., a memory controller) through a contact pad on the semiconductor package. However, with recent increases in integration and communication speed of semiconductor devices, noise is generated during signal transmission through the pad. Excessive noise is caused reflected waves produced during the signal transmission/reception to/from the external apparatus at high speeds. Such reflected waves are introduced through the pad, resulting in noise. The noise may corrupt data and cause other problems, which may reduce reliability and degrade performance of the semiconductor device.

SUMMARY

Some embodiments of the present inventive concepts provide a semiconductor package with improved noise reduction and drive reliability.

Some embodiments of the present inventive concepts provide a compact-sized semiconductor package.

Some embodiments of the present inventive concepts provide a semiconductor package with improved electrical properties.

According to some embodiments of the present inventive concepts, a semiconductor package may comprise: a substrate; a semiconductor chip on the substrate; a vertical structure on the substrate and disposed on one side of the semiconductor chip; a molding layer on the substrate, the molding layer surrounding the semiconductor chip and the vertical structure; and a conductive pattern on the molding layer. The vertical structure may include: a first part connected to a ground conductor of the substrate; and at least one second part on the first part and having a width less than a width of the first part. The conductive pattern may include: at least one pad vertically spaced from the second part; and an inductor pattern connected to the first pad. The at least one second part and the at least one pad may form at least one capacitor.

According to some embodiments of the present inventive concepts, a semiconductor package may comprise: a substrate; a semiconductor chip mounted on the substrate in a face-down state; a first vertical structure and a second vertical structure on the substrate, the first vertical structure and a second vertical structure being on one side of the semiconductor chip and horizontally spaced from each other; a molding layer on the substrate, the molding layer surrounding the semiconductor chip, the first vertical structure, and the second vertical structure; and a redistribution layer on the molding layer. Each of the first and second vertical structure may include: a first part on a top surface of the substrate; and a second part on the first part. The redistribution layer may include: a first pad above the first vertical structure, the first pad and the second part of the first vertical structure forming a capacitor; a second pad above the second vertical structure and coupled to the second part of the second vertical structure; an inductor pattern connected to the first pad; and a passivation layer on the molding layer, the passivation layer covering the first pad, the second pad, and the inductor pattern.

According to some embodiments of the present inventive concepts, a semiconductor package may comprise: a semiconductor chip; a first redistribution layer on an active surface of the semiconductor chip; a second redistribution layer on an inactive surface of the semiconductor chip; a ground structure on one side of the semiconductor chip and coupled to a ground conductor of the first redistribution layer; a signal pattern on one side of the semiconductor chip and coupled to a signal conductor of the first redistribution layer; a first post that extends from the ground structure toward the second redistribution layer; and a second post that extends from the signal pattern toward the second redistribution layer. The second redistribution layer may include: a first pad on the first post; a second pad coupled to the second post; and an inductor pattern connected to the first pad. The first pad and the first post may be vertically spaced from each other to form one capacitor. The inductor pattern may not vertically overlap the first post.

BRIEF DESCRIPTION OF THE DRAWINGS

In the following description, various elements of the same or similar type may be distinguished by annexing a reference legend shown in the drawings with a second legend that distinguishes among the same/similar elements (e.g., 522a, 522b). However, if a given description uses only the first reference legend (e.g., 522) it is applicable to any one of the same/similar elements having the same first reference legend irrespective of the second legend. Elements and features may not be drawn to scale in the drawings.

FIGS. 9, 10, 11, 12, 13 and 14 illustrate respective cross-sectional views that show a method of fabricating a semiconductor package according to some embodiments of the present inventive concepts.

DETAILED DESCRIPTION OF EMBODIMENTS

Figure 1:
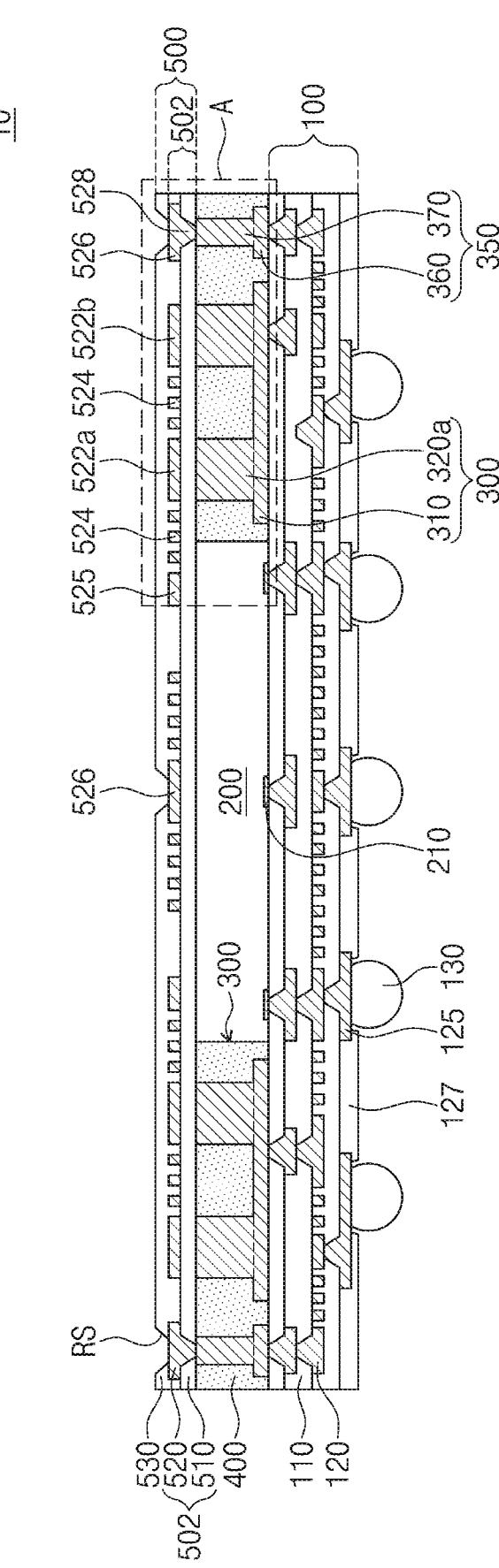
FIG. 1 illustrates a cross-sectional view that shows a semiconductor package according to some embodiments of the present inventive concepts.

The following description will describe embodiments of a semiconductor package according to the present inventive concepts with reference to the accompanying drawings.

Herein, for brevity, once an element is introduced with a name followed by a legend, the element may be subsequently referred to by an abbreviated form of the name followed by the legend. For example, "first substrate dielectric layer 110" may be later referred to as just "dielectric layer 110" or "layer 110".

Herein, when a first circuit element is said to be "connected to" a second circuit element, it can either be directly connected to the second element (i.e., without an intervening element), or, an intervening element(s) may be present. If the context discusses a first element being connected to a second element, and refers to a drawing showing the relevant elements physically connected (as in a circuit schematic where both elements are connected to the same circuit node), then the drawing provides an example of the first element being "directly connected" to the second element, but it is understood that the addition of an intervening element may be possible in an alternative embodiment to that illustrated.

Similarly, when an element or layer is said to be "on" or "disposed on" another element or layer, it can be directly on (i.e., a direct physical interface exists), or, an intervening element(s) or layer(s) may be present. If the context discusses a first element or layer being "on" a second element or layer, and refers to a drawing showing the relevant elements or layers physically interfacing, then the drawing provides an example of the first element or layer being "directly on" the second element or layer, without an intervening element or layer, but it is understood that the addition of an intervening element or layer may be possible in an alternative embodiment to that illustrated.

Figure 2:
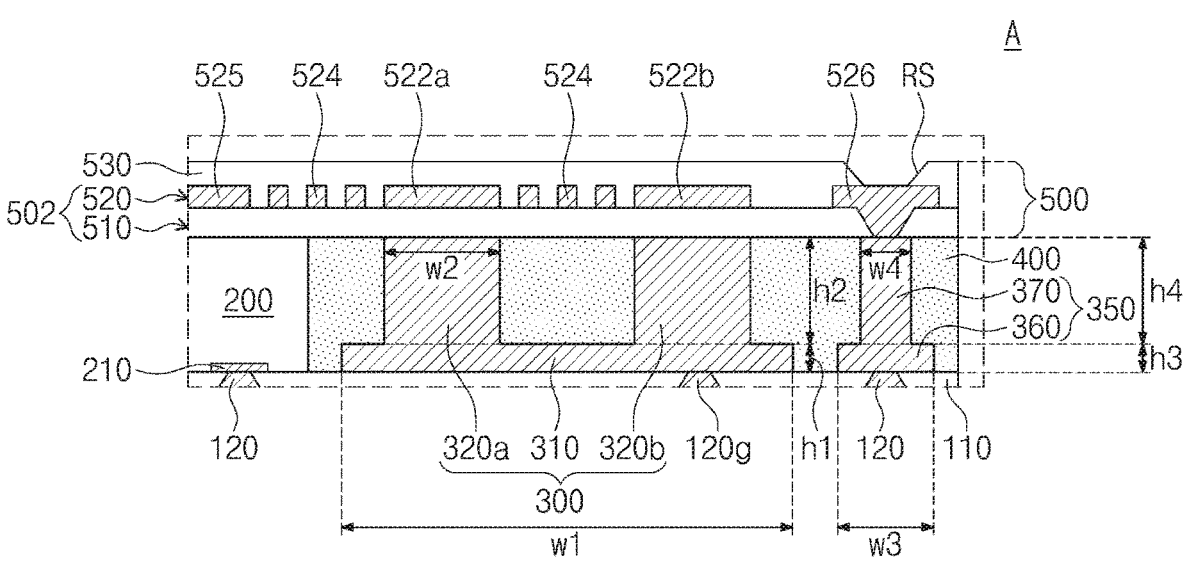
FIG. 2 illustrates an enlarged view that shows section A of FIG. 1.
Figure 3A:
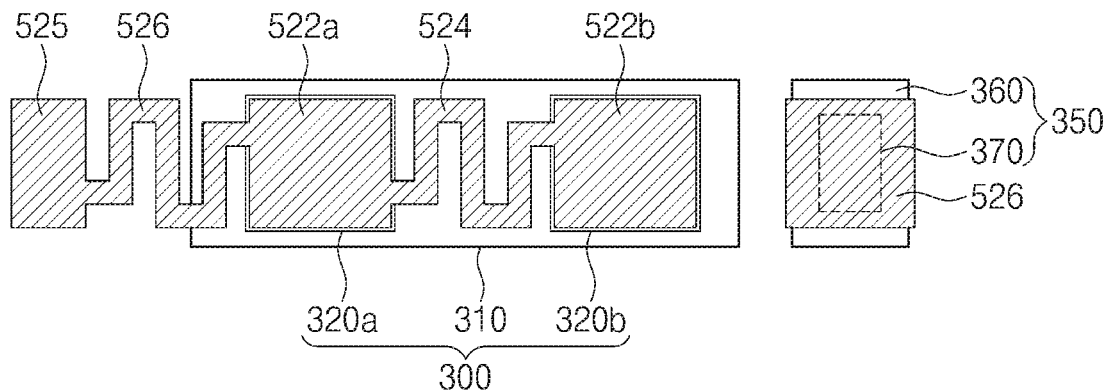
FIGS. 3A and 3B illustrate respective plan views that show planar shapes of vertical structures and a conductive pattern of a redistribution layer.
Figure 3B:
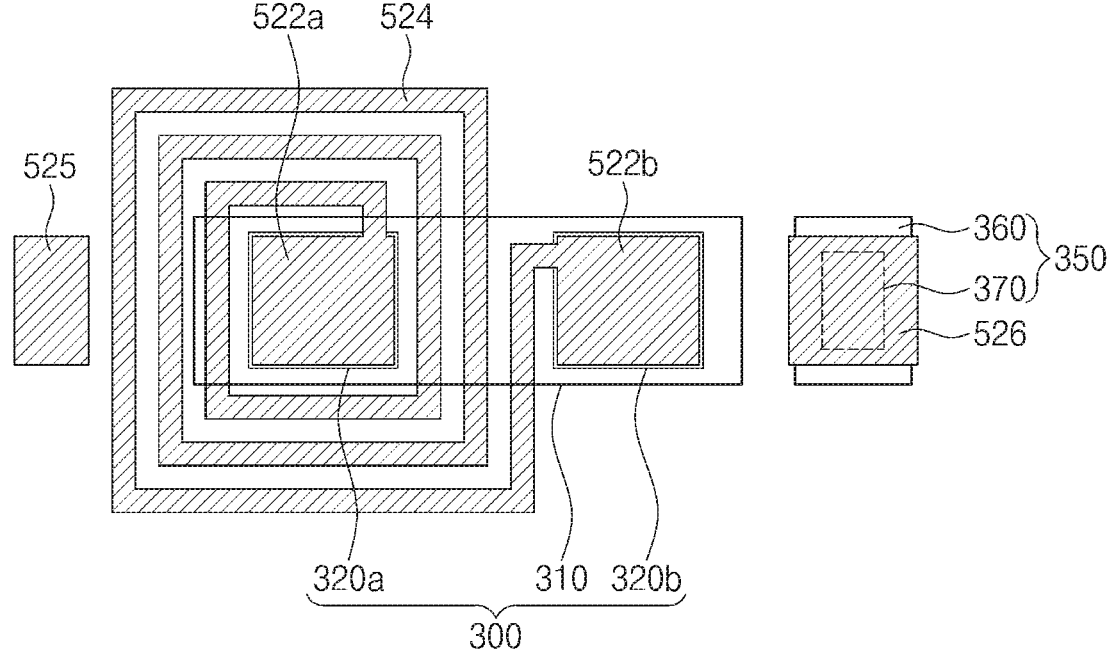

FIG. 1 illustrates a cross-sectional view that shows a semiconductor package, 10, according to some embodiments of the present inventive concepts. Structures within semiconductor package 10 may hereafter be described in the context of an xyz coordinate system, where the z direction is considered a vertical (thickness) direction and any direction within the xy plane is considered a horizontal direction. FIG. 2 illustrates an enlarged view that shows section A of FIG. 1. FIGS. 3A and 3B illustrate top plan views that show planar shapes (in the xy plane) of vertically oriented ("vertical") structures and a conductive pattern of a redistribution layer. Herein, unless the context indicates otherwise, a plan view of a described structure is a view from the top of the semiconductor package 10 as illustrated in FIG. 1.

Referring to FIG. 1, semiconductor package 10 may include a centrally located semiconductor chip 200 sandwiched between a lower package substrate 100 and an upper redistribution layer (RDL) 500. Semiconductor package 10 may also include a molding layer 400 peripherally surrounding semiconductor chip 200 (in the xy plane). The molding layer 400 may encapsulate conductive structures that may include ground conductors, connective structures between upper RDL 500 and a lower RDL within the package substrate 100, and vertically oriented capacitor electrodes, all described in detail hereafter. Briefly, conductive structures encapsulated by the molding layer 400 may form, in conjunction with dielectric material and circuitry directly above, a noise reduction low pass filter with improved characteristics.

The package substrate 100 may be a redistribution substrate. For example, the package substrate 100 may include two or more substrate wiring layers stacked on each other. In this description, the term "substrate wiring layer" may indicate a wiring layer obtaining by patterning one dielectric material layer and one conductive material layer. For example, one substrate wiring layer may have conductive patterns, or horizontally extending wiring lines, that do not vertically overlap each other. Each of the substrate wiring layers may include "first substrate" dielectric layers 110 and "first substrate" wiring patterns 120 in the dielectric layers 110. The dielectric layers 110 may be processed ("patterned") to form channels within which electrical conductors of the wiring patterns 120 may be formed. The electrical conductors of the wiring patterns 120 may extend horizontally within the channels to form conductive traces. The wiring patterns 120 of one substrate wiring layer may be electrically connected to the wiring patterns 120 of an adjacent substrate wiring layer.

The dielectric layers 110 may include an inorganic dielectric layer, such as a silicon oxide (SiO) layer or a silicon nitride (SiN) layer. Alternatively or additionally, dielectric layers 110 may include a polymeric material. Dielectric layers 110 may include a dielectric polymer or a photo-imageable dielectric (PID). Some examples of the photo-imageable dielectric may include photosensitive polyimide, polybenzoxazole (PB 0), phenolic polymers, benzocyclobutene polymers or any combination thereof.

As mentioned, the wiring patterns 120 may be provided in the dielectric layers 110 (e.g., in channels thereof) or formed on outer planar surfaces of dielectric layers 110. The wiring pattern 120 may have a damascene structure. For example, the wiring patterns 120 may each have a head part and a tail part that are integrally connected into a single unitary piece. The head part may be a wire or pad portion that allows a wiring line in the package substrate 100 to extend horizontally. The tail part may be a via portion that allows a wiring line in the package substrate 100 to vertically connect to a certain component. The first substrate wiring patterns 120 may each have an inverse T shape when viewed in a cross sectional view.

With respect to each of the substrate wiring layers, the head parts of the first substrate wiring patterns 120 may be buried in an upper portion of the first substrate dielectric layer 110, and may have their top surfaces exposed on a top surface of the first substrate dielectric layer 110. With respect to each of the substrate wiring layers, the tail parts of the first substrate wiring patterns 120 may extend from the top surfaces of the head parts of the first substrate wiring patterns 120, and may penetrate the first substrate dielectric layer 110 of an overlying substrate wiring layer and may be coupled to head parts of other first substrate wiring patterns 120.

A top surface of the tail part of an uppermost first substrate wiring pattern 120 may be exposed on a top surface of the first substrate dielectric layer 110 in an uppermost substrate wiring layer. The first substrate wiring patterns 120 may include a conductive material. For example, the first substrate wiring patterns 120 may include copper (Cu). The first substrate wiring patterns 120 may redistribute a semiconductor chip 200 mounted on the package substrate 100.

FIG. 1 depicts that the tail parts of the first substrate wiring patterns 120 protrude onto the head parts of the first substrate wiring patterns 120, but the present inventive concepts are not limited thereto. The first substrate wiring patterns 120 may each be shaped like a T (in a cross-sectional view) in which the tail part is connected to a bottom surface of the head part. For example, the top surface of the head part of the first substrate wiring pattern 120 may be exposed on the top surface of the first substrate dielectric layer 110, and the tail part of the first substrate wiring pattern 120 may be exposed on a bottom surface of the first substrate dielectric layer 110. The tail part may be coupled to the head part of the first substrate wiring pattern 120 of the substrate wiring layer that underlies the tail part.

Although not shown, a barrier layer may be interposed between the first substrate dielectric layer 110 and the first substrate wiring pattern 120. The barrier layer may conformally cover lateral and bottom surfaces of the first substrate wiring pattern 120. A range of about 50 Å to about 1,000 Å may be given as a thickness of the barrier layer, or a thickness of a gap between the first substrate wiring pattern 120 and the first substrate dielectric layer 110. The barrier layer may include metal such as titanium (Ti) or tantalum (Ta) or metal nitride such as titanium nitride (TiN) or tantalum nitride (TaN).

The package substrate 100 may cause a semiconductor package to have a fan-out structure. The first substrate wiring pattern 120 may be connected to substrate pads 125 provided on a bottom surface of the package substrate 100. The substrate pads 125 may be pads on which external terminals 130 are disposed. The substrate pads 125 may penetrate a lowermost first substrate dielectric layer 110 to be coupled to the first substrate wiring patterns 120.

A protection layer 127 may be disposed on the bottom surface of the package substrate 100. The protection layer 127 may expose the substrate pads 125 while covering the first substrate dielectric layers 110 and the first substrate wiring patterns 120. The protection layer 127 may include an Ajinomoto build-up film (ABF), an organic material, an inorganic material, or a dielectric polymer such as an epoxy-based polymer.

A plurality of external terminals 130 may be disposed below the package substrate 100. For example, the external terminals 130 may be disposed on the substrate pads 125 provided on the bottom surface of the package substrate 100. For more detail, the external terminals 130 may be coupled to bottom surfaces of the substrate pads 125 exposed by the protection layer 127. The external terminals 130 may include solder balls or solder bumps, and based on type of the external terminals 130, a semiconductor package may be provided in the shape of one of a ball grid array (BGA) type, a fine ball-grid array (FBGA) type, and a land grid array (LGA) type.

The semiconductor chip 200 may be disposed on the package substrate 100. The semiconductor chip 200 may be disposed on a top face of the package substrate 100. The semiconductor chip 200 may be, for example, a logic chip or a memory chip. The semiconductor chip 200 may be disposed in a face-down state on the package substrate 100. For example, the semiconductor chip 200 may have a front side that faces the package substrate 100 and a rear side that is opposite to the front side. In this description, the language "front side" may be defined to refer to a surface on an active surface of an integrated element in a semiconductor chip or to a surface on which are formed a plurality of pads of the semiconductor chip, and the language "rear side" may be defined to refer to an opposite surface that faces the front side. The semiconductor chip 200 may include chip pads 210 on its bottom surface. The chip pads 210 may be electrically connected to an integrated circuit of the semiconductor chip 200.

The semiconductor chip 200 may be mounted on the package substrate 100. For example, the front side of the semiconductor chip 200 may face the package substrate 100. The front side of the semiconductor chip 200 may be in contact with the top surface of the package substrate 100. In this case, the chip pads 210 of the semiconductor chip 200 may be in contact with the top surface of the package substrate 100, and a portion of the uppermost first substrate wiring pattern 120 may penetrate an uppermost first substrate dielectric layer 110 to be coupled to the chip pads 210. For example, the chip pads 210 of the semiconductor chip 200 may be directly connected to the first substrate wiring pattern 120 of the package substrate 100.

Referring to FIGS. 1 and 2, a first vertical structure 300 may be provided on the package substrate 100. The first vertical structure 300 may be disposed horizontally spaced from the semiconductor chip 200. The first vertical structure 300 may have a first part 310 in contact with the package substrate 100 and at least one second part 320a and/or 320b disposed on the first part 310.

The first part 310 may be disposed on the package substrate 100 one side of the semiconductor chip 200. The first part 310 may be in direct contact with the top surface of the package substrate 100. The first part 310 may horizontally extend on the package substrate 100. For example, the first part 310 may have a linear, bar, or plate shape that extends in a direction parallel to the top surface of the package substrate 100. The first part 310 may correspond to a base pattern (or "common pattern") which is connected to at least one second part 320a and/or 320b (discussed below). The first part 310 may be electrically connected to the package substrate 100.

For example, the first part 310 may be in contact with the top surface of the package substrate 100, and a portion of the uppermost first substrate wiring pattern 120 may penetrate the uppermost first substrate dielectric layer 110 to be coupled to the first part 310. For example, the first part 310 may be directly connected to the first substrate wiring pattern 120 of the package substrate 100. The first part 310 may be coupled to a ground conductor of the package substrate 100. For example, the first part 310 may correspond to a ground structure, and may be connected to an external ground through the package substrate 100 (e.g., through wiring 120g) and the external terminals 130. The first part 310 may include a metallic material. For example, the first part 310 may be formed of copper (Cu).

According to some embodiments, a seed/barrier layer may be interposed between a bottom surface of the first part 310 and the package substrate 100 and between a lateral surface of the first part 310 and a molding layer 400 which will be discussed below. The seed/barrier layer may cover the lateral and bottom surfaces of the first part 310. The seed/barrier layer may include a metallic material, such as gold (Au), titanium (Ti), or tantalum (Ta). Alternatively, the seed/barrier layer may include metal nitride, such as titanium nitride (TiN) or tantalum nitride (TaN).

The second part 320 may be provided on the first part 310. The second part 320 may upwardly extend from a top surface of the first part 310. For example, the second part 320 may be a conductive post that vertically extends on the first part 310. The second part 320 may have a cylindrical pillar shape that extends in a direction perpendicular to the top surface of the first part 310.

In this description, the term "post" may denote a connection terminal that vertically penetrates a certain component, and no limitation is imposed on a planar shape of the post. For example, the shape of the post may include a circular pillar shape, a polygonal pillar shape, a partition shape, or a wall shape.

The second part 320 may be connected through the first part 310 to a ground conductor of the package substrate 100. The second part 320 may have a second width w2 less than a first width w1 of the first part 310. The second part 320 may have an area less than that of the first part 310. The second part 320 may have a second height h2 greater than a first height h1 of the first part 310.

A single second part 320a or at least two second parts 320a and 320b may be provided. When a plurality of second parts 320a and 320b are provided as shown in FIGS. 1 and 2, the second parts 320a and 320b may be disposed horizontally spaced from each other on the first part 310. For example, there may be provided a plurality of first vertical structures 300 (two are shown in FIG. 1, one each on the left and right sides of chip 200) each including one first part 310 and at least one second part 320, and the first parts 310 of neighboring first vertical structures 300 may be integrally connected into a single unitary piece.

The second part 320 and the first part 310 may have a continuous configuration and may have no visible interface therebetween. For example, the second part 320 and the first part 310 may be formed of the same material and may have no interface therebetween. For example, the second part 320 and the first part 310 may be provided in a single component. In this case, the second part 320 and the first part 310 may form a single unitary piece. The second part 320 may include a metallic material. For example, the second part 320 may be formed of copper (Cu).

According to some embodiments, a seed/barrier layer may be interposed between a bottom surface of the second part 320 and the first part 310 and between a lateral surface of the second part 320 and a molding layer 400 which will be discussed below. The seed/barrier layer may cover the lateral and bottom surfaces of the second part 320. The seed/barrier layer may include a metallic material, such as gold (Au), titanium (Ti), or tantalum (Ta). Alternatively, the seed/barrier layer may include metal nitride, such as titanium nitride (TiN) or tantalum nitride (TaN).

A second vertical structure 350 may be provided on the package substrate 100. The second vertical structure 350 may be disposed horizontally spaced from the semiconductor chip 200. The second vertical structure 350 may be disposed horizontally spaced from the first vertical structure 300. For example, as illustrated in FIG. 1, the second vertical structure 350 may be positioned farther away than the first vertical structure 300 from the semiconductor chip 200. For another example, the second vertical structure 350 may be disposed closer than the first vertical structure 300 to the semiconductor chip 200, and the first vertical structure 300 may be positioned farther away than the second vertical structure 350 from the semiconductor chip 200. The present inventive concepts, however, are not limited thereto, and the first and second vertical structures 300 and 350 may be variously disposed based on line layouts of the package substrate 100 and a redistribution layer 500 which will be discussed below. The second vertical structure 350 may have a third part 360 in contact with the package substrate 100 and at least one fourth part 370 disposed on the third part 360.

The third part 360 may be disposed on the package substrate 100 on one side of the semiconductor chip 200. The third part 360 may be spaced from the first part 310 of the first vertical structure 300. The third part 360 may be in direct contact with the top surface of the package substrate 100. The third part 360 may horizontally extend on the package substrate 100. For example, the third part 360 may have a linear, bar, or plate shape that extends in a direction parallel to the top surface of the package substrate 100. The third part 360 may correspond to a base pattern (or common pattern) to which is connected at least one fourth part 370 which will be discussed below.

The third part 360 may be electrically connected to the package substrate 100. For example, the third part 360 may be in contact with the top surface of the package substrate 100, and a portion of the uppermost first substrate wiring pattern 120 may penetrate the uppermost first substrate dielectric layer 110 to be coupled to the third part 360. For example, the third part 360 may be directly connected to the first substrate wiring pattern 120 of the package substrate 100. The third part 360 may be coupled to a signal conductor of the package substrate 100. For example, the third part 360 may correspond to a signal pattern, and may be connected either to the semiconductor chip 200 through the package substrate 100 or to an external circuit through the package substrate 100 and the external terminals 130. The third part 360 may include a metallic material. For example, the third part 360 may be formed of copper (Cu).

According to some embodiments, a seed/barrier layer may be interposed between a bottom surface of the third part 360 and the package substrate 100 and between a lateral surface of the third part 360 and a molding layer 400 which will be discussed below. The seed/barrier layer may cover the lateral and bottom surfaces of the third part 360. The seed/barrier layer may include a metallic material, such as gold (Au), titanium (Ti), or tantalum (Ta). Alternatively, the seed/barrier layer may include metal nitride, such as titanium nitride (TiN) or tantalum nitride (TaN). When a seed/barrier layer is provided on the first part 310 of the first vertical structure 300, a seed/barrier layer may also be provided on the third part 360 of the second vertical structure 350, and when no seed/barrier layer is provided on the first part 310 of the first vertical structure 300, no seed/barrier layer may also be provided on the third part 360 of the second vertical structure 350.

The fourth part 370 may be provided on the third part 360. The fourth part 370 may upwardly extend from a top surface of the third part 360. For example, the fourth part 370 may be a conductive post that vertically extends on the third part 360. The fourth part 370 may have a cylindrical pillar shape that extends in a direction perpendicular to the top surface of the third part 360. The fourth part 370 may be connected through the third part 360 to a signal conductor of the package substrate 100. The fourth part 370 may have a fourth width w4 less than a third width w3 of the third part 360. The fourth part 370 may have an area less than that of the third part 360. The area of the second part 320 of the first vertical structure 300 may be about 2 times to 10 times the area of the fourth part 370 of the second vertical structure 350. The fourth part 370 may have a fourth height h4 greater than a third height h3 of the third part 360.

The fourth part 370 and the third part 360 may have a continuous configuration and may have no visible interface therebetween. For example, the fourth part 370 and the third part 360 may be formed of the same material and may have no interface therebetween. For example, the fourth part 370 and the third part 360 may be provided in a single component. In this case, the fourth part 370 and the third part 360 may form a single unitary piece. The fourth part 370 may include a metallic material. For example, the fourth part 370 may be formed of copper (Cu).

According to some embodiments, a seed/barrier layer may be interposed between a bottom surface of the fourth part 370 and the third part 360 and between a lateral surface of the fourth part 370 and a molding layer 400 which will be discussed below. The seed/barrier layer may cover the lateral and bottom surfaces of the fourth part 370. The seed/barrier layer may include a metallic material, such as gold (Au), titanium (Ti), or tantalum (Ta). Alternatively, the seed/barrier layer may include metal nitride, such as titanium nitride (TiN) or tantalum nitride (TaN). When a seed/barrier layer is provided on the second part 320 of the first vertical structure 300, a seed/barrier layer may also be provided on the fourth part 370 of the second vertical structure 350, and when no seed/barrier layer is provided on the second part 320 of the first vertical structure 300, no seed/barrier layer may also be provided on the fourth part 370 of the second vertical structure 350.

A molding layer 400 may be provided on the package substrate 100. The molding layer 400 may cover the top surface of the package substrate 100. When viewed in a plan view, the molding layer 400 may surround the semiconductor chip 200. The molding layer 400 may cover lateral surfaces of the semiconductor chip 200 and expose the rear side of the semiconductor chip 200. A top surface of the molding layer 400 may be coplanar with the rear side of the semiconductor chip 200. The molding layer 400 may encapsulate the first vertical structure 300 and the second vertical structure 350. The molding layer 400 may cover a lateral surface of the first vertical structure 300 and a lateral surface of the second vertical structure 350, and may expose a top surface of the first vertical structure 300 (or a top surface of the second part 320) and a top surface of the second vertical structure 350 (or a top surface of the fourth part 370). The molding layer 400, the second part 320, and the fourth part 370 may have their top surfaces coplanar with each other. The molding layer 400 may include a dielectric material, such as an epoxy molding compound (EMC).

A redistribution layer 500 may be provided on the molding layer 400. The redistribution layer 500 may cover the semiconductor chip 200 and the molding layer 400. The redistribution layer 500 may be in direct contact with the top surface of the molding layer 400, a top surface of the semiconductor chip 200, the top surface of the first vertical structure 300, and the top surface of the second vertical structure 350. The redistribution layer 500 may be a redistribution substrate. For example, the redistribution layer 500 may include one second substrate wiring layer 502. Wiring layer 502 may include a second substrate dielectric layer 510 and a second substrate wiring pattern 520 on dielectric layer 510.

Dielectric layer 510 may cover the semiconductor chip 200 and the molding layer 400. The second substrate dielectric layer 510 may be in direct contact with the top surface of the molding layer 400, the top surface of the semiconductor chip 200, the top surface of the first vertical structure 300, and the top surface of the second vertical structure 350. Dielectric layer 510 may include a dielectric polymer or a photo-imageable dielectric (PID). For example, the photo-imageable dielectric may include at least one selected from photosensitive polyimide (PI), polybenzoxazole (PBO), phenolic polymers, and benzocyclobutene polymers. material. Alternatively or additionally, dielectric layer 510 may include silicon oxide (SiO), silicon nitride (SiN), silicon oxynitride (SiON), dielectric polymers or combinations thereof.

Wiring pattern 520 may be provided on dielectric layer 510. Wiring pattern 520 may horizontally extend (in the x-y plane) on the dielectric layer 510. Wiring pattern 520 may be a conductive pattern for redistribution in wiring layer 502 and for noise reduction circuit. Wiring pattern 520 may include a conductive material such as copper (Cu). Wiring pattern 520 may have a damascene structure. For example, wiring pattern 520 may have a tail part 528 and a head part 522, 524, and 526 that are integrally connected into a single unitary piece. The tail part 528 and the head part 522, 524, and 526 of the second substrate wiring pattern 520 may be shaped like a T when viewed in a cross-sectional view.

The head part 522, 524, and 526 may be provided on a top surface of the second substrate dielectric layer 510. For example, the head part 522, 524, and 526 may protrude onto the top surface of the second substrate dielectric layer 510.

The head part 522, 524, and 526 of the second substrate wiring pattern 520 may be a pad part, a circuit part, or a wire part for horizontally expanding a line in the redistribution layer 500. For example, the head part 522, 524, and 526 may include at least one first pad 522a and/or 522b that forms a capacitor for noise reduction circuit, an inductor pattern 524 that forms an inductor for noise reduction circuit, and a second pad 526 coupled to a signal conductor of the package substrate 100. The at least one first pad 522, the inductor pattern 524, and the second pad 526 may be conductive patterns located at the same level.

The first pad 522a and/or 522b may be positioned above the second part 320a and/or 320b, respectively, of the first vertical structure 300. The first pad 522 may be positioned on the top surface of the second substrate dielectric layer 510. The second substrate dielectric layer 510 may vertically separate the first pad 522 from the second part 320. The first pad 522a and the second part 320a may form a first capacitor, and the first pad 522b and the second part 320b may form a second capacitor. For example, the first pad 522a and/or 522b and the second part 320a and/or 320b may each be to a capacitor electrode of the capacitor, and a portion of the second substrate dielectric layer 510 interposed between the first pad 522 and the second part 320 may correspond to a capacitor dielectric of the capacitor. A dielectric constant of the capacitor may be determined by the material and thickness of the second substrate dielectric layer 510 between the capacitor electrodes. When the second part 320 includes a plurality of second parts such as 320a and 320b, a plurality of first pads such as 522a and 522b may also be provided, and each of the first pads 522a/b may be disposed on one second part 320a/b. In this case, one capacitor may be formed by a pair of the first pad 522a or 522b and the corresponding second part 320a or 320b.

To increase capacitance of the capacitor, the first pad 522 and the second part 320 may each have a large area. The areas (in a plan view) of the first pad 522 and the second part 320 may be substantially identical or similar to each other, and each may be greater than an area (in a plan view) of the fourth part 370 of the second vertical structure 350. For example, the area of the first pad 522 and the area of the second part 320 may each be about 2 times to 10 times the area of the fourth part 370. In addition, the first pad 522 and the second part 320 may have cross-sectional shapes ("planar shapes", as seen in a plan view) that vertically overlap each other and are substantially identical or similar to each other.

For example, as illustrated in FIG. 3A, when the second part 320 has a square pillar shape, the first pad 522 may have a tetragonal shape when viewed in a plan view. Alternatively, when the second part 320 has a cylindrical shape, the first pad 522 may have a circular shape when viewed in a plan view. The first pad 522 and the second part 320 may be provided to have the same planar shape and to overlap each other, and thus an overlapping area between the first pad 522 and the second part 320 may be increased to increase capacitance of the capacitor. In other examples, the first pad 522 and the second part 320 do not have the same or similar planar shape.

The inductor pattern 524 may be positioned on the top surface of the second substrate dielectric layer 510. The inductor pattern 524 may be connected to the first pad 522. One end of the inductor pattern 524 may be connected to the first pad 522, and another end of the inductor pattern 524 may be connected to an inductor pad 525. The inductor pad 525 may be a portion of the second substrate wiring pattern 520 or a conductive pattern located at the same level as that of the first pad 522 and that of the inductor pattern 524. FIG. 1 depicts that the inductor pad 525 is positioned on the semiconductor chip 200, but if necessary, the inductor pad 525 may be disposed on various positions.

The inductor pattern 524 may form an inductor connected to the first pad 522. The inductor pattern 524 may be achieved in various pattern shapes. For example, the inductor pattern 524 may be provided in a meandering pattern as shown in FIG. 3A or in a spiral pattern as shown in FIG. 3B. The inductor structure mentioned above is merely exemplary, and the present inventive concepts are not limited thereto. A line width of inductor pattern 524 may be less than a width of the first pad 522. When viewed in a plan view, the inductor pattern 524 may be disposed on one side of the first vertical structure 300. The second part 320 of the first vertical structure 300 may not be provided beneath the inductor pattern 524. For example, the inductor pattern 524 and the second part 320 may not vertically overlap each other.

When the first pad 522 includes a plurality of first pads 522, the inductor pattern 524 may connect neighboring first pads 522 to each other. When three or more first pads 522 are provided, the inductor pattern 524 may include a plurality of inductor patterns 524, and each of the inductor patterns 524 may connect to each other a pair of neighboring first pads 522. One of the inductor patterns 524 may connect one of the first pad 522 to the inductor pad 525. When viewed in a plan view, the inductor pattern 524 may be disposed between the second parts 320 of the first vertical structure 300. The second parts 320 of the first vertical structure 300 may not be provided beneath the inductor pattern 524. For example, the inductor pattern 524 may not vertically overlap any of the second parts 320.

The second pad 526 may be positioned above the fourth part 370 of the second vertical structure 350. The second pad 526 may be positioned on the top surface of the second substrate dielectric layer 510. The second pad 526 may be horizontally spaced from the first pad 522 and the inductor pattern 524. The second pad 526 may be electrically floated from the first pad 522 and the inductor pattern 524. The second pad 526 may be a pad for receiving signals from the exterior or transmitting signals to the exterior. The second pad 526 may include a plurality of second pads 526, and one or more of the second pads 526 may be disposed on the semiconductor chip 200 and may be connected to each other through wiring lines of the second substrate wiring pattern 520. Alternatively, the one or more of the second pads 526 may be connected through wiring lines of the second substrate wiring pattern 520 to the tail parts 528 of the second substrate wiring pattern 520 which will be discussed below.

The tail part 528 of the second substrate wiring pattern 520 may be a via portion that connects the second pad 526 to the second vertical structure 350. The tail part 528 may be coupled to the second vertical structure 350. For example, the tail part 528 of the second substrate wiring pattern 520 may extend from a bottom surface of the second pad 526 of the head part 522, 524, and 526, and may penetrate the second substrate dielectric layer 510 to be coupled to the fourth part 370 of the second vertical structure 350 that underlies the second substrate dielectric layer 510.

According to some embodiments of the present inventive concepts, a capacitor may be formed by the first pad 522 and the second part 320 connected to a ground conductor of the package substrate 100 through the first part 310 of the first vertical structured 300, and an inductor may be formed by the inductor pattern 524 connected to the first pad 522. Therefore, the first vertical structure 300, the first pad 522, and the inductor pattern 524 may form a noise reduction circuit in which the capacitor and the inductor are connected to each other. For example, the noise reduction circuit may include a low pass filter. The noise reduction circuit may block or filter a harmonic component of a signal transmitted between a semiconductor package and an external apparatus. For example, during signal transmission, a reflected signal may be generated due to impedance mismatching at the semiconductor package. In this case, the semiconductor package may receive the reflected signal together with the signal. The noise reduction circuit according to the present inventive concepts may prevent introduction of the reflected signal into the semiconductor package. Accordingly, the semiconductor package may transceive only a signal from which the reflected signal is removed, and as a result may increase in operating reliability.

In addition, as the first pad 522 and the second part 320 of the first vertical structure 300 vertically overlap each other to form the capacitor of the noise reduction circuit, the capacitor may have a decreased area and the noise reduction circuit may have a reduced overall area. Accordingly, the semiconductor package may become compact-sized.

Moreover, the inductor pattern 524 that forms the inductor does not overlap the second part 320 that forms the capacitor, and the second part 320 may be provided to have a height relatively greater than that of the first part 310 to allow the inductor pattern 524 to lie away from the first part 310. Therefore, the inductor pattern 524 and the capacitor may have small parasitic capacitance therebetween, and the semiconductor package may increase in electrical properties.

Although not shown, a seed/barrier layer may be interposed between the second substrate dielectric layer 510 and the second substrate wiring pattern 520. The seed/barrier layer may cover lateral and bottom surfaces of the second substrate wiring pattern 520. The seed/barrier layer may include a metallic material, such as gold (Au), titanium (Ti), or tantalum (Ta). Alternatively, the seed/barrier layer may include metal nitride, such as titanium nitride (TiN) or tantalum nitride (TaN).

The redistribution layer 500 may further include a passivation layer 530 provided on the second substrate dielectric layer 510. The passivation layer 530 may cover the second substrate wiring pattern 520. The passivation layer 530 may include a dielectric polymer or a photo-imageable dielectric (PID). For example, the photo-imageable dielectric may include at least one selected from photosensitive polyimide (PI), polybenzoxazole (PBO), phenolic polymers, and benzocyclobutene polymers. Alternatively, the passivation layer 530 may include a dielectric material. For example, the passivation layer 530 may include silicon oxide (SiO), silicon nitride (SiN), silicon oxynitride (SiON), or dielectric polymers.

The passivation layer 530 may have a recess RS that exposes the second pad 526. Terminals of an external apparatus may be coupled to the second pad 526 exposed by the recess RS.

Figure 4:
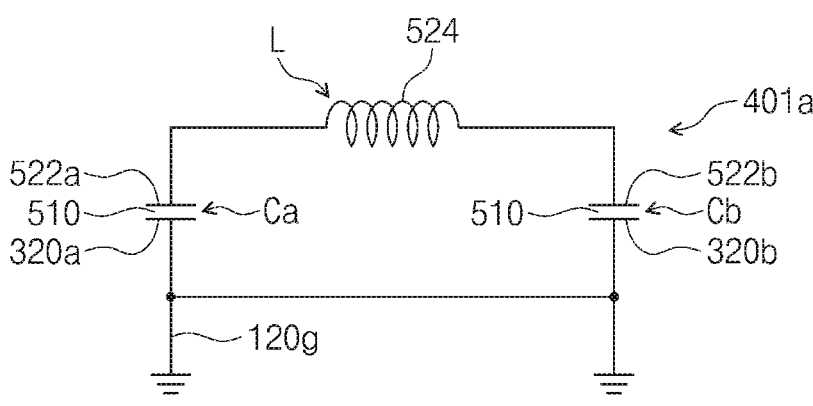
FIG. 4 illustrates schematic diagrams of example noise reduction filters that may be formed by circuitry within the semiconductor package.
Figure 4:
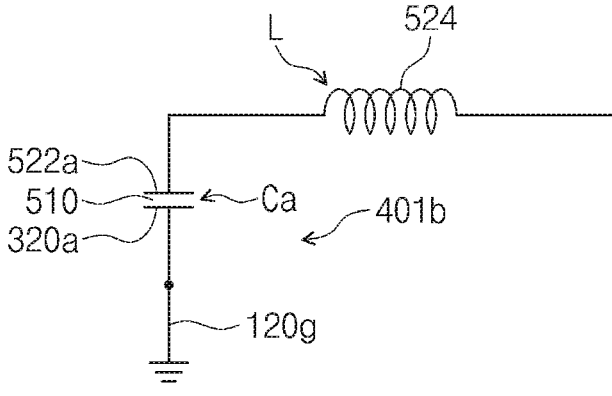

FIG. 4 illustrates schematic diagrams of example noise reduction filters that may be formed by circuitry within the semiconductor package. A noise reduction filter 401a may be a low pass filter formed by a first capacitor Ca, a second capacitor Cb, and an inductor L connected between capacitors Ca and Cb. Capacitor Ca may have a first electrode (second part 320a) connected to ground through wiring pattern 120g, a second, opposite electrode (pad 522a), and dielectric material therebetween (the portion of dielectric layer 510 between second part 320a and pad 522a). Capacitor Cb may have a first electrode (second part 320b) connected to ground, a second, opposite electrode (pad 522b), and dielectric material therebetween (the portion of dielectric layer 510 between second part 320b and pad 522b). Inductor L may be connected between the second electrodes of the capacitors Ca and Cb and may be formed by wiring 524 of FIG. 3A or 3B.

If first vertical structure 300 has only a single second part such as 522a, a noise reduction filter 401b may include a single capacitor Ca (or Cb), in which the second electrode (pad 522a) is connected to one terminal of inductor L. The opposite terminal of inductor L may be connected to ground or to another conductor within semiconductor package 10.

Figure 5:
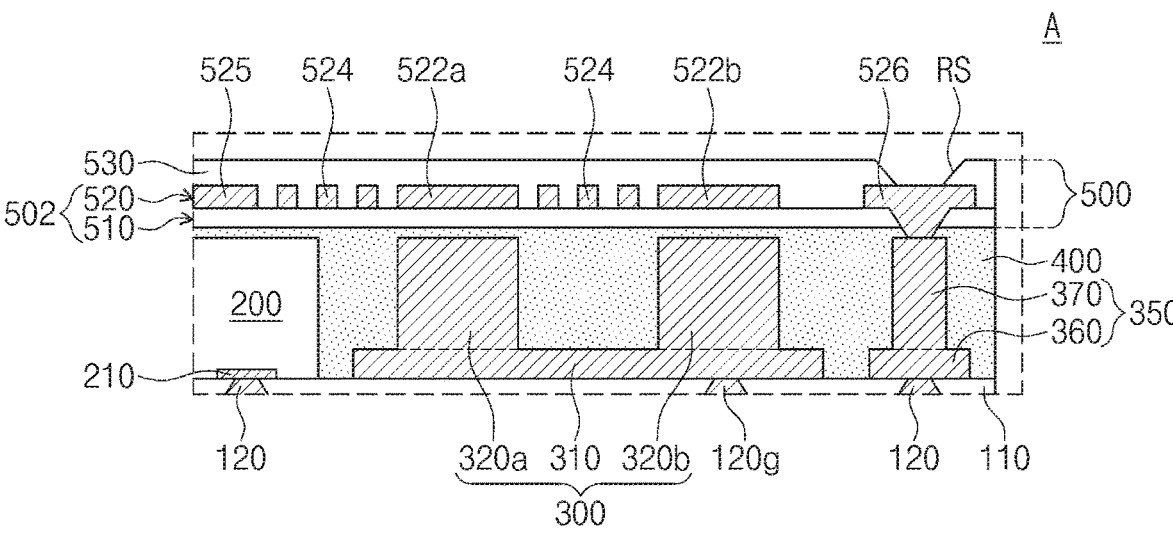
FIGS. 5 and 6 illustrate respective cross-sectional views of section A depicted in FIG. 1.

FIG. 5 illustrates a cross-sectional view of section A depicted in FIG. 1, that shows a semiconductor package according to some embodiments of the present inventive concepts. In the embodiments that follow, components the same as those discussed with reference to FIGS. 1 to 4 are allocated the same reference numerals thereto, and a repetitive explanation thereof will be omitted or abridged for convenience of description. The following description will focus on differences between the embodiments of FIGS. 1 to 4 and other embodiments described below.

Referring to FIG. 5, a molding layer 400 may be provided on the package substrate 100. The molding layer 400 may cover the semiconductor chip 200, the first vertical structure 300, and the second vertical structure 350. For example, the molding layer 400 may cover the top surface of the semiconductor chip 200, the top surface of the first vertical structure 300, and the top surface of the second vertical structure 350. The semiconductor chip 200, the first vertical structure 300, and the second vertical structure 350 may be buried in the molding layer 400, and may not be exposed outwardly from the molding layer 400.

A redistribution layer 500 may be provided on the molding layer 400. The redistribution layer 500 may cover the molding layer 400. The redistribution layer 500 may be in direct contact with a top surface of the molding layer 400. The redistribution layer 500 may include one second substrate wiring layer 502. The second substrate wiring layer 502 may include a second substrate dielectric layer 510 and a second substrate wiring pattern 520 on the second substrate dielectric layer 510.

A first pad 522 of the second substrate wiring pattern 520 may be positioned above the second part 320 of the first vertical structure 300. The first pad 522 and the second part 320 may form a capacitor. For example, the first pad 522 and the second part 320 may each correspond to a capacitor electrode, and a portion of each of the molding layer 400 and the second substrate dielectric layer 510 that are interposed between the first pad 522 and the second part 320 may correspond to a capacitor dielectric. A dielectric constant of dielectric between the capacitor electrodes may be determined by using a material and thickness of each of the molding layer 400 and the second substrate dielectric layer 510 that are interposed between the first pad 522 and the second part 320.

The second pad 526 may be positioned above the fourth part 370 of the second vertical structure 350. The second pad 526 may be positioned on a top surface of the second substrate dielectric layer 510. The tail part 528 of the second substrate wiring pattern 520 may be a via portion that connects the second pad 526 to the second vertical structure 350. The tail part 528 may be coupled to the second vertical structure 350. For example, the tail part 528 of the second substrate wiring pattern 520 may extend from a bottom surface of the second pad 526 of the head part 522, 524, and 526, and may penetrate the second substrate dielectric layer 510 and the molding layer 400 to be coupled to the fourth part 370 of the second vertical structure 350 that underlies the second substrate dielectric layer 510 and the molding layer 400.

Figure 6:
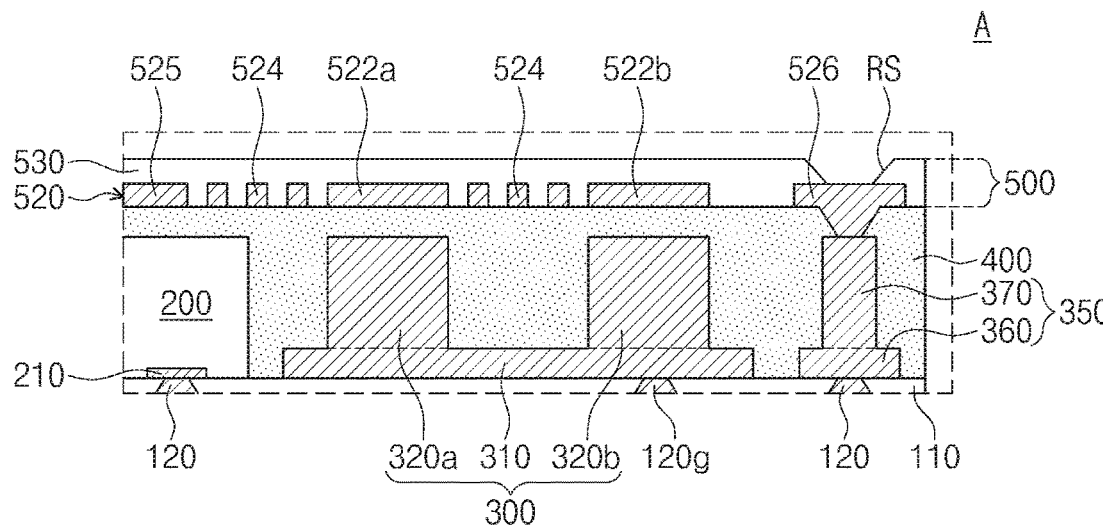

FIG. 6 illustrates a cross-sectional view of section A depicted in FIG. 1, that shows a semiconductor package according to some embodiments of the present inventive concepts.

Referring to FIG. 6, a molding layer 400 may be provided on the package substrate 100. The molding layer 400 may cover the semiconductor chip 200, the first vertical structure 300, and the second vertical structure 350. For example, the molding layer 400 may cover the top surface of the semiconductor chip 200, the top surface of the first vertical structure 300, and the top surface of the second vertical structure 350. The semiconductor chip 200, the first vertical structure 300, and the second vertical structure 350 may be buried in the molding layer 400, and may not be exposed outwardly from the molding layer 400.

A redistribution layer 500 may be provided on the molding layer 400. The redistribution layer 500 may cover the molding layer 400. In the embodiment of FIG. 6, the redistribution layer 500 may include no second substrate dielectric layer 510. For example, a second substrate wiring pattern 520 may be provided on the molding layer 400. The second substrate wiring pattern 520 may horizontally extend on the molding layer 400.

A first pad 522 of the second substrate wiring pattern 520 may be positioned above the second part 320 of the first vertical structure 300. The first pad 522 and the second part 320 may form a capacitor. For example, the first pad 522 and the second part 320 may each correspond to a capacitor electrode, and a portion of the molding layer 400 interposed between the first pad 522 and the second part 320 may correspond to a capacitor dielectric. A material and thickness of the molding layer 400 between the first pad 522 and the second part 320 may be used to determine a dielectric constant between the capacitor electrodes.

The second pad 526 may be positioned above the fourth part 370 of the second vertical structure 350. The second pad 526 may be positioned on a top surface of the molding layer 400. A tail part 528 of the second substrate wiring pattern 520 may be a via portion that connects the second pad 526 to the second vertical structure 350. The tail part 528 may be coupled to the second vertical structure 350. For example, the tail part 528 of the second substrate wiring pattern 520 may extend from a bottom surface of the second pad 526 of the head part 522, 524, and 526, and may penetrate the molding layer 400 to be coupled to the fourth part 370 of the second vertical structure 350 that underlies the molding layer 400.

Figure 7:
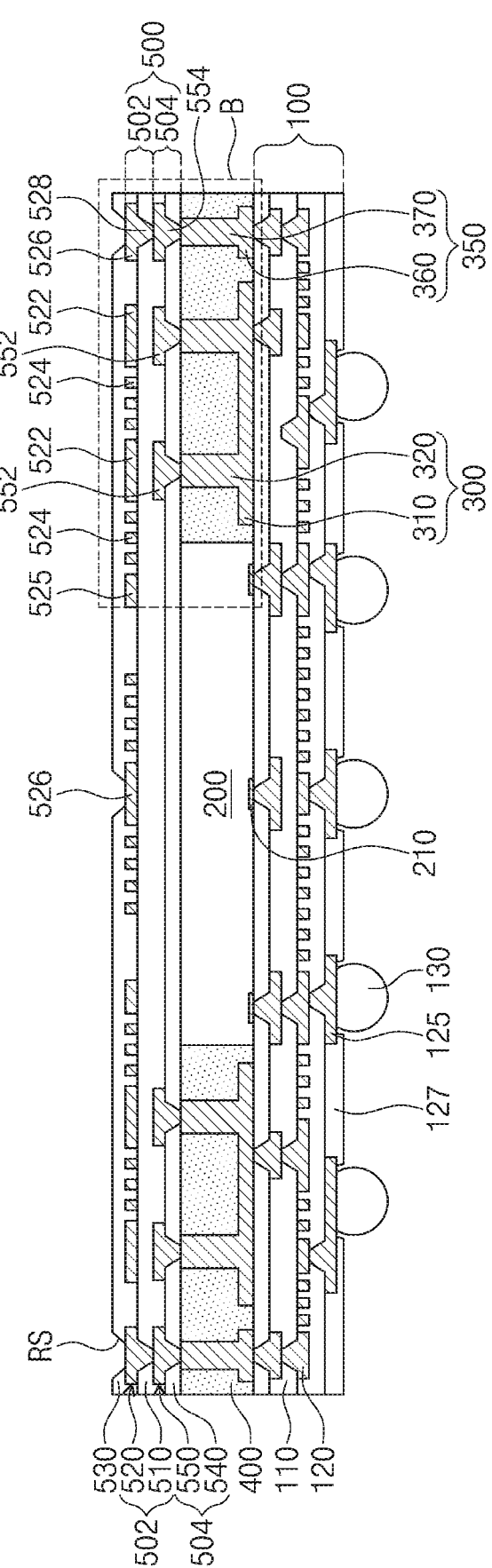
FIG. 7 illustrates a cross-sectional view that shows a semiconductor package according to some embodiments of the present inventive concepts.
Figure 8:
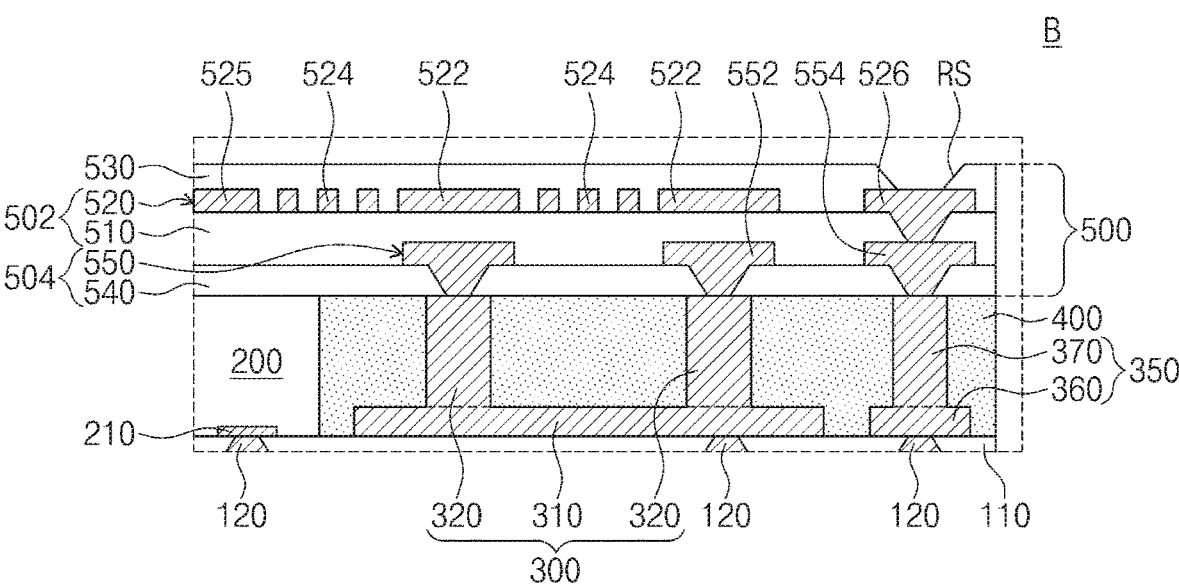
FIG. 8 illustrates an enlarged view that shows section B of FIG. 7.

FIG. 7 illustrates a cross-sectional view that shows a semiconductor package according to some embodiments of the present inventive concepts. FIG. 8 illustrates an enlarged view that shows section B of FIG. 7.

Referring to FIGS. 7 and 8, the redistribution layer 500 may include at least two substrate wiring layers. For example, the redistribution layer 500 may further include a third substrate wiring layer 504 provided beneath the second substrate wiring layer 502. The third substrate wiring layer 504 may be positioned between the molding layer 400 and the second substrate wiring layer 502.

The second substrate wiring layer 502 may have a configuration identical or similar to that discussed with reference to FIGS. 1 to 4. For example, the second substrate wiring layer 502 may include a second substrate dielectric layer 510 and a second substrate wiring pattern 520 on the second substrate dielectric layer 510. The second substrate wiring pattern 520 may include at least one first pad 522 that forms a capacitor for noise reduction circuit, an inductor pattern 524 that forms an inductor for noise reduction circuit, and a second pad 526 coupled to a signal conductor of the package substrate 100.

The third substrate wiring layer 504 may be interposed between the molding layer 400 and the second substrate wiring layer 502. The third substrate wiring layer 504 may include a third substrate dielectric layer 540 and a third substrate wiring pattern 550 on the third substrate dielectric layer 540.

The third substrate dielectric layer 540 may cover the semiconductor chip 200 and the molding layer 400. The third substrate dielectric layer 540 may be in direct contact with the top surface of the molding layer 400, the top surface of the semiconductor chip 200, the top surface of the first vertical structure 300, and the top surface of the second vertical structure 350. The third substrate dielectric layer 540 may include a dielectric polymer or a photo-imageable dielectric (PID). For example, the photo-imageable dielectric may include at least one selected from photosensitive polyimide (PI), polybenzoxazole (PBO), phenolic polymers, and benzocyclobutene polymers. Alternatively, the third substrate dielectric layer 540 may include a dielectric material. For example, the third substrate dielectric layer 540 may include silicon oxide (SiO), silicon nitride (SiN), silicon oxynitride (SiON), or dielectric polymers.

A third substrate wiring pattern 550 may be provided on the third substrate dielectric layer 540. The third substrate wiring pattern 550 may horizontally extend on the third substrate dielectric layer 540. The third substrate wiring pattern 550 may include a conductive material. For example, the third substrate wiring pattern 550 may include copper (Cu). The third substrate wiring pattern 550 may have a damascene structure. For example, the third substrate wiring pattern 550 may have a head part and a tail part that are integrally connected into a single unitary piece. The head and tail parts of the third substrate wiring pattern 550 may be shaped like a T when viewed in a cross sectional view. The third substrate wiring pattern 550 may have a third pad 552 and a fourth pad 554.

The third pad 552 may be positioned above the second part 320 of the first vertical structure 300. The head part of the third pad 552 may be positioned on a top surface of the third substrate dielectric layer 540, and the tail part of the third pad 552 may penetrate the third substrate dielectric layer 540 to be coupled to the second part 320 of the first vertical structure 300. The third pad 552 and the first pad 522 may form a capacitor. For example, the third pad 552 and the first pad 522 may each correspond to a capacitor electrode, and a portion the third substrate dielectric layer 540 interposed between the third pad 552 and the first pad 522 may correspond to a capacitor dielectric. A material and thickness of the third substrate dielectric layer 540 may be used to determine a dielectric constant between capacitor electrodes. When the second part 320 includes a plurality of second parts 320, each of the first pad 522 and the third pad 552 may also include a plurality of first pads 522 and a plurality of third pads 552, and each of the third pads 552 may be connected to one second part 320. In this case, a pair of corresponding first and third pads 522 and 552 may form one capacitor. The first pad 522 and the third pad 552 may have their areas that are substantially identical or similar to each other. The first pad 522 and the third pad 552 may have their planar shapes that are substantially identical or similar to each other, and the planar areas may vertically overlap each other.

According to some embodiments of the present inventive concepts, in order to use as a capacitor electrode, the third pad 552 may be separately used which is connected to the second part 320 of the first vertical structure 300, and thus the capacitor may be easy to adjust its area.

The fourth pad 554 may be positioned above the fourth part 370 of the second vertical structure 350. A head part of the fourth pad 554 may be positioned on a top surface of the third substrate dielectric layer 540, and a tail part of the fourth pad 554 may penetrate the third substrate dielectric layer 540 to be coupled to the fourth part 370 of the second vertical structure 350. The fourth pad 554 may be horizontally spaced from the third pad 552. The fourth pad 554 may be electrically floated from the third pad 552.

The second pad 526 may be provided above the fourth pad 554. The second pad 526 may be positioned on a top surface of the second substrate dielectric layer 510. The tail part 528 of the second substrate wiring pattern 520 may be a via portion that connects the second pad 526 to the fourth pad 554. The tail part 528 may be coupled through the fourth pad 554 to the second vertical structure 350. For example, the tail part 528 of the second substrate wiring pattern 520 may extend from a bottom surface of the second pad 526, and may penetrate the second substrate dielectric layer 510 to be coupled to the fourth pad 554.

FIGS. 9 to 14 illustrate cross-sectional views that show a method of fabricating a semiconductor package according to some embodiments of the present inventive concepts.

Figures 9, 10:
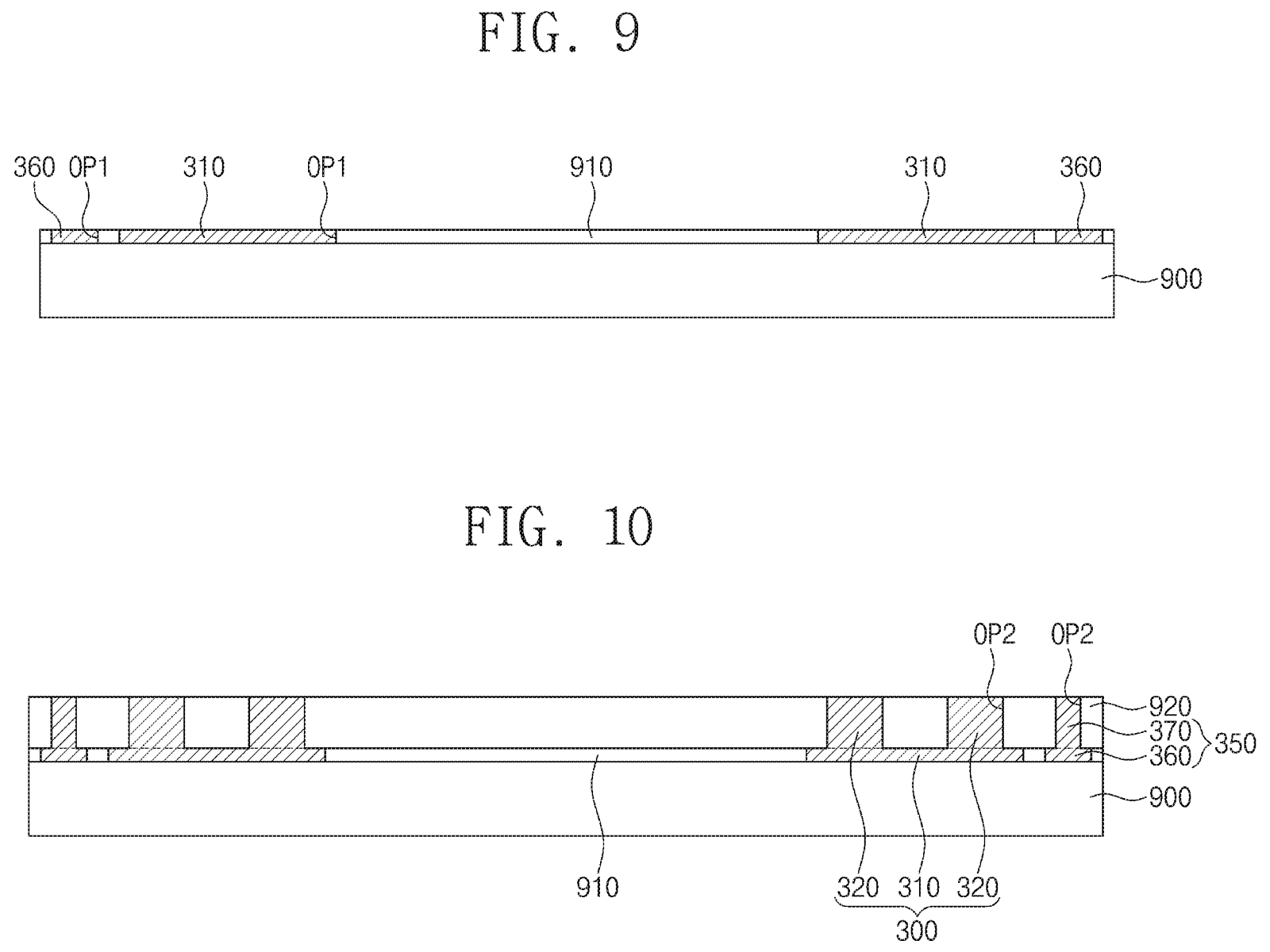

Referring to FIG. 9, a carrier substrate 900 may be provided. The carrier substrate 900 may be a dielectric substrate including glass or polymer, or may be a conductive substrate including metal. Although not shown, the carrier substrate 900 may be provided with an adhesive member on a top surface of the carrier substrate 900. For example, the adhesive member may include a glue tape.

A first vertical structure 300 and a second vertical structure 350 may be formed on the carrier substrate 900. The following will describe in detail the formation of the first and second vertical structures 300 and 350.

Referring still to FIG. 9, there may be formed on the carrier substrate 900 a first part 310 of the first vertical structure 300 and a third part 360 of the second vertical structure 350. For example, a first sacrificial layer 910 may be formed on the carrier substrate 900. The first sacrificial layer 910 may cover the top surface of the carrier substrate 900. The first sacrificial layer 910 may include, for example, a photoresist material. The first sacrificial layer 910 may undergo an etching process to form first openings OP1 that penetrate the first sacrificial layer 910. The first openings OP1 may expose the top surface of the carrier substrate 900. The first openings OP1 may define regions where the first part 310 and the third part 360 are formed. Afterwards, the first openings OP1 may be filled with a conductive material to form the first part 310 and the third part 360.

Referring to FIG. 10, there may be formed on the carrier substrate 900 a second part 320 of the first vertical structure 300 and a fourth part 370 of the second vertical structure 350. For example, a second sacrificial layer 920 may be formed on the first sacrificial layer 910. The second sacrificial layer 920 may cover a top surface of the first sacrificial layer 910, a top surface of the first part 310, and a top surface of the third part 360. The second sacrificial layer 920 may include, for example, a photoresist material. The second sacrificial layer 920 may undergo an etching process to form second openings OP2 that penetrate the second sacrificial layer 920 and expose the first part 310 and the third part 360. Each of the second openings OP2 may expose the top surface of the first part 310 or the top surface of the third part 360. The second openings OP2 may define regions wherein the second part 320 and the fourth part 370 are formed. The second openings OP2 may have their widths less than those of the first openings OP1. Afterwards, the second openings OP2 may be filled with a conductive material to form the second part 320 and the fourth part 370.

Therefore, the first vertical structure 300 may be formed to include the first part 310 and the second part 320 on the first part 310, and the second vertical structure 350 may be formed to include the third part 360 and the fourth part 370 on the third part 360. The first and second sacrificial layers 910 and 920 may be removed subsequently.

Figures 11, 12:
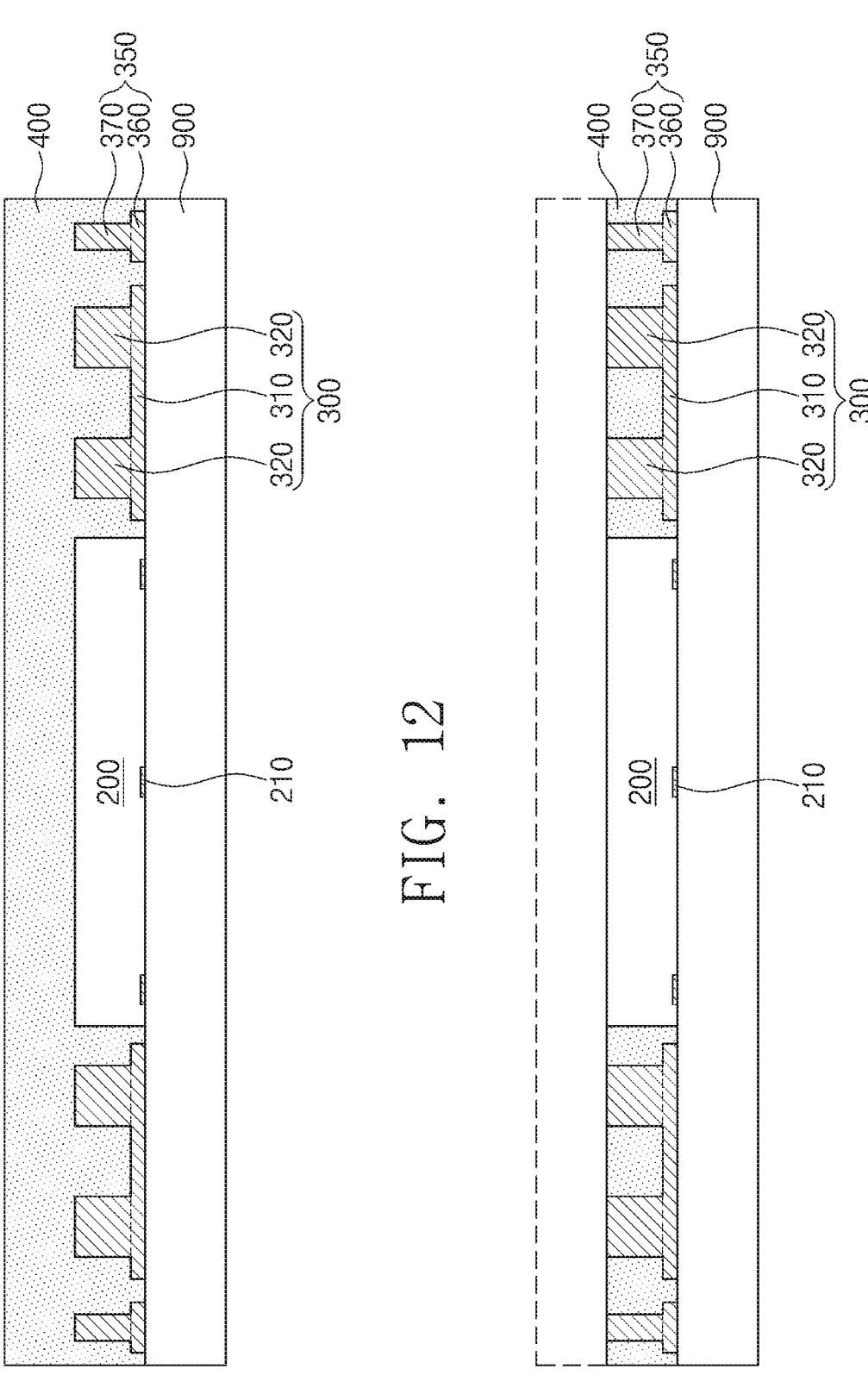

Referring to FIG. 11, a semiconductor chip 200 may be provided on the carrier substrate 900. The semiconductor chip 200 may be the same as the semiconductor chip 200 discussed with reference to FIGS. 1 to 9. The semiconductor chip 200 may be provided on a central portion of the carrier substrate 900. For example, on the carrier substrate 900, the first and second vertical structures 300 and 350 may be positioned more outwardly than the semiconductor chip 200. In this step, the semiconductor chip 200 may be attached onto the carrier substrate 900. The semiconductor chip 200 may have chip pads 210 disposed thereunder. For example, the semiconductor chip 200 may have a bottom surface in contact with the carrier substrate 900, and the bottom surface may be an active surface of the semiconductor chip 200.

A molding layer 400 may be formed on the carrier substrate 900. On the carrier substrate 900, the molding layer 400 may cover the semiconductor chip 200, the first vertical structure 300, and the second vertical structure 350. For example, a dielectric member may be coated on the carrier substrate 900, and then the dielectric member may be cured to form the molding layer 400.

Referring to FIG. 12, a portion of the molding layer 400 may be removed. For example, the molding layer 400 may undergo a thinning process. For example, a grinding process or a chemical mechanical polishing (CMP) process may be performed on a top surface of the molding layer 400. Therefore, the top surface of the molding layer 400 may become planarized. The thinning process may be performed until the exposure of a top surface of the semiconductor chip 200, a top surface of the first vertical structure 300 (or a top surface of the second part 320), and a top surface of the second vertical structure 350 (or a top surface of the fourth part 370). The thinning process may remove a partial upper portion of the molding layer 400, and if necessary, may also remove a partial upper portion of the second part 320 or a partial upper portion of the fourth part 370.

Figure 13:
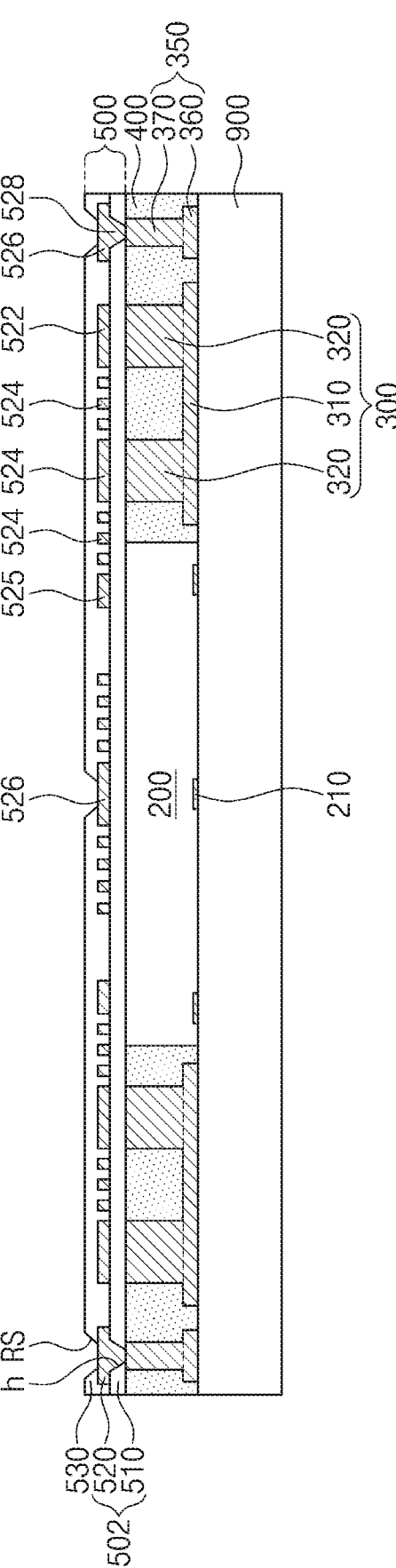

Referring to FIG. 13, a second substrate dielectric layer 510 may be formed on the molding layer 400. The second substrate dielectric layer 510 may be formed by coating and curing a dielectric material on the molding layer 400. The second substrate dielectric layer 510 may be patterned to form a through hole h. The through hole h may expose the top surface of the fourth part 370 of the second vertical structure 350.

A second substrate wiring pattern 520 may be formed on the second substrate dielectric layer 510. For example, a seed/barrier layer may be formed on a top surface of the second substrate dielectric layer 510, a mask pattern may be formed on the seed/barrier layer, and then forming the second substrate wiring pattern 520 by performing a plating process in which the seed/barrier layer exposed by the mask pattern is used as a seed. Afterwards, the mask pattern may be removed, and a portion of the seed/barrier layer below the mask pattern may also be removed. Therefore, one second substrate wiring layer 502 may be formed to have the second substrate dielectric layer 510 and the second substrate wiring pattern 520. The second substrate wiring pattern 520 may include a first pad 522 positioned above the second part 320 of the first vertical structure 300, an inductor pattern 524 connected to the first pad 522, and a second pad 526 positioned above the fourth part 370 of the second vertical structure 350 and coupled via the through hole h to the fourth part 370.

According to some embodiments, the second substrate wiring pattern 520 may be formed by forming on the second substrate dielectric layer 510 a conductive layer that covers the top surface of the second substrate dielectric layer 510 and fills the through hole h, and then patterning the conductive layer.

A passivation layer 530 may be formed on the second substrate dielectric layer 510. The passivation layer 530 may be formed by coating and curing a dielectric material on the second substrate dielectric layer 510. The passivation layer 530 may be formed to cover the second substrate wiring pattern 520. The passivation layer 530 may be patterned to form a recess RS that exposes the second pad 526. The recess RS may expose a top surface of the second pad 526.

Figure 14:
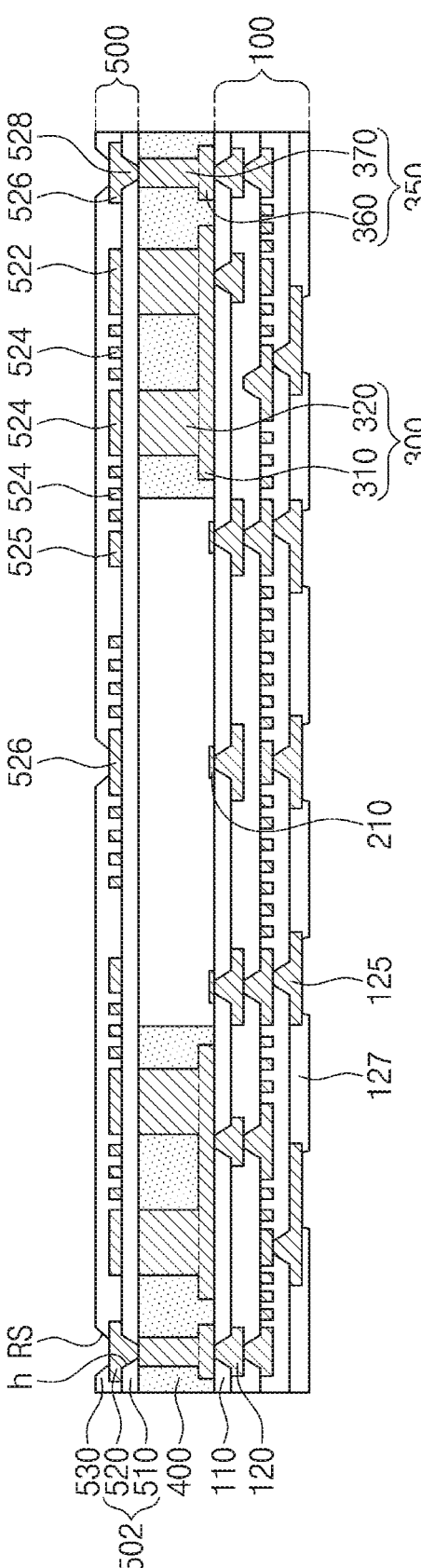

Referring to FIG. 14, the carrier substrate 900 may be removed to expose a bottom surface of the molding layer 400, a bottom surface of the semiconductor chip 200, a bottom surface of the first vertical structure 300 (or a bottom surface of the first part 310), and a bottom surface of the second vertical structure 350 (or a bottom surface of the third part 360).

A first substrate dielectric layer 110 may be formed on the bottom surface of the molding layer 400. The first substrate dielectric layer 110 may be formed by coating and curing a dielectric material on the bottom surface of the molding layer 400. The first substrate dielectric layer 110 may cover the bottom surface of the molding layer 400, the bottom surface of the first vertical structure 300, and the bottom surface of the second vertical structure 350. The dielectric material may include a photo-imageable dielectric (PID).

The first substrate dielectric layer 110 may be patterned to form openings. The openings may expose bottom surfaces of the chip pads 210 in the semiconductor chip 200, the bottom surface of the first vertical structure 300, and the bottom surface of the second vertical structure 350.

A first substrate wiring pattern 120 may be formed on the first substrate dielectric layer 110. For example, a seed/barrier layer may be formed on a bottom surface of the first substrate dielectric layer 110, a mask pattern may be formed on the seed/barrier layer, and the first substrate wiring pattern 120 may be formed by performing a plating process in which the seed/barrier layer exposed by the mask pattern is used as a seed. Afterwards, the mask pattern may be removed, and the seed/barrier layer positioned below the mask pattern may also be removed.

Therefore, a first substrate wiring layer may be formed to have the first substrate dielectric layer 110 and the first substrate wiring pattern 120. The formation of the first substrate wiring layer may be repeatedly performed to form a package substrate 100 in which a plurality of first substrate wiring layers are stacked. The first substrate wiring pattern 120 of a lowermost first substrate wiring layer may correspond to substrate pads 125 of the package substrate 100.

A protection layer 127 may be formed on a bottom surface of the package substrate 100. For example, the protection layer 127 may be formed by depositing a dielectric material on a bottom surface of a lowermost first substrate dielectric layer 110. For example, the dielectric material may include silicon oxide (SiO), silicon nitride (SiN), silicon oxynitride (SiON), or dielectric polymers. Thereafter, the protection layer 127 may be patterned to expose bottom surfaces of the substrate pads 125.

Referring back to FIG. 1, external terminals 130 may be provided on the bottom surface of the package substrate 100. For example, the external terminals 130 may be disposed on the substrate pads 125 exposed by the protection layer 127. The external terminals 130 may include a solder ball or a solder bump.

A semiconductor package according to some embodiments of the present inventive concepts may include a noise reduction circuit where at least one capacitor, in which a vertical structure and a pad are vertically connected, is connected to an inductor pattern which is horizontally connected to the pad. The noise reduction circuit may prevent the semiconductor package from being infiltrated with noise such as reflected signals, and the semiconductor package may exhibit improved operation reliability.

In addition, because the capacitor of the noise reduction circuit is vertically configured, the capacitor may occupy a small area, and the overall area of the noise reduction circuit may be smaller than conventional noise reduction circuits. Accordingly, the size of the semiconductor package may be reduced.

Moreover, the inductor pattern and the capacitor may have a reduced parasitic capacitance therebetween, and the semiconductor package may exhibit improved electrical properties.

Although the present inventive concepts have been described in connection with some embodiments of the present inventive concepts illustrated in the accompanying drawings, it will be understood by one of ordinary skill in the art that variations in form and detail may be made therein without departing from the spirit and scope of the present inventive concepts. The above disclosed embodiments should thus be considered illustrative and not restrictive.

What is claimed is:

1. A semiconductor package, comprising:
   a substrate;
   a semiconductor chip on the substrate;
   a vertical structure on the substrate and disposed on one side of the semiconductor chip;
   a molding layer on the substrate, the molding layer surrounding the semiconductor chip and the vertical structure; and
   a conductive pattern on the molding layer,
   wherein the vertical structure includes:
      a first part connected to a ground conductor of the substrate; and
      at least one second part on the first part and having a width less than a width of the first part,
   wherein the conductive pattern includes:
      at least one pad vertically spaced from the second part; and
      an inductor pattern connected to the at least one pad, and
   wherein the at least one second part and the at least one pad form at least one capacitor.

2. The semiconductor package of claim 1, wherein the at least one second part includes a plurality of second parts,
   wherein the plurality of second parts are horizontally spaced from each other on the first part.

3. The semiconductor package of claim 2, wherein the at least one pad includes a plurality of pads,
   wherein each of the plurality of pads is on a respective one of the second parts, and
   wherein a pair of one of the pads and one of the second parts vertically correspond to each other and form a first capacitor of the at least one capacitor.

4. The semiconductor package of claim 3, wherein the inductor pattern connects neighboring ones of the pads to each other.

5. The semiconductor package of claim 1, wherein
   the inductor pattern and the second part of the vertical structure do not vertically overlap each other.

6. The semiconductor package of claim 1, wherein, when viewed in a plan view, a width of the pad is greater than a line width of the inductor pattern.

7. The semiconductor package of claim 1, wherein a surface area of the first pad is substantially the same as a surface area of the second part.

8. The semiconductor package of claim 1, wherein the inductor pattern is one of a spiral pattern and a meandering pattern.

9. The semiconductor package of claim 1, wherein a height of the first part is less than a height of the second part.

10. The semiconductor package of claim 1, wherein the vertical structure is a first vertical structure, and the semiconductor package further comprising a second vertical structure on one side of the semiconductor chip and spaced from the first vertical structure,
   wherein the second vertical structure includes:
      a third part connected to a signal conductor of the substrate; and
      a fourth part on the third part and having a width less than a width of the third part, and
   wherein the conductive pattern further includes a second pad disposed on the fourth part and coupled to the fourth part.

11. The semiconductor package of claim 10, wherein, an end surface of the second part has a surface area about two to ten times an area of an end surface of the fourth part.

12. The semiconductor package of claim 10, further comprising a passivation layer on the molding layer and covering the conductive pattern, wherein the passivation layer has a recess that exposes the second pad.

13. A semiconductor package, comprising:

a substrate;

a semiconductor chip mounted on the substrate in a face-down state;

a first vertical structure and a second vertical structure on the substrate, the first vertical structure and the second vertical structure being on one side of the semiconductor chip and horizontally spaced from each other;

a molding layer on the substrate, the molding layer surrounding the semiconductor chip, the first vertical structure, and the second vertical structure; and a redistribution layer on the molding layer, wherein each of the first and second vertical structures includes:

a first part on a top surface of the substrate; and a second part on the first part, and wherein the redistribution layer includes:

a first pad above the first vertical structure, the first pad and the second part of the first vertical structure forming a capacitor;

a second pad above the second vertical structure and coupled to the second part of the second vertical structure;

an inductor pattern connected to the first pad; and a passivation layer on the molding layer, the passivation layer covering the first pad, the second pad, and the inductor pattern.

14. The semiconductor package of claim 13, wherein the first part of the first vertical structure is coupled to a ground conductor of the substrate, and the first part of the second vertical structure is coupled to a signal conductor of the substrate.

15. The semiconductor package of claim 13, further comprising a third vertical structure substantially the same as the first vertical structure, wherein the first parts of the first and third vertical structures are connected into a single unitary piece, and wherein the second parts of the first and third vertical structures are horizontally spaced from each other.

16. The semiconductor package of claim 15, further comprising a third pad, wherein each of the first pad and the third pad is on one of the second parts of the first vertical structure, and wherein a pair of the first pad and one of the second parts form one capacitor, the pair of the first pad and the second part vertically corresponding to each other, and a pair of the third pad and another one of the second parts, vertically corresponding to each other, form a further capacitor.

17. The semiconductor package of claim 15, wherein, when viewed in a plan view, the inductor pattern is between the second parts of the first and third vertical structures.

18. The semiconductor package of claim 13, wherein a height of the first part is less than a height of the second part.

19. A semiconductor package, comprising:

a semiconductor chip;

a first redistribution layer on an active surface of the semiconductor chip;

a second redistribution layer on an inactive surface of the semiconductor chip;

a ground structure on one side of the semiconductor chip and coupled to a ground conductor of the first redistribution layer;

a signal pattern on one side of the semiconductor chip and coupled to a signal conductor of the first redistribution layer;

a first post that extends from the ground structure toward the second redistribution layer; and a second post that extends from the signal pattern toward the second redistribution layer, wherein the second redistribution layer includes:

a first pad on the first post;

a second pad coupled to the second post; and an inductor pattern connected to the first pad, wherein the first pad and the first post are vertically spaced from each other to form one capacitor, and wherein the inductor pattern does not vertically overlap the first post.

20. The semiconductor package of claim 19, wherein a width of the first post is less than a width of the ground structure, a width of the second post is less than a width of the signal pattern, a height of the ground structure and a height of the signal pattern are less than a height of the first post and a height of the second post, and the first pad, the second pad, and the inductor pattern are at the same level.

\* \* \* \* \*